United States Patent [19]

Tsuchimoto

[11] Patent Number: 5,518,960
[45] Date of Patent: May 21, 1996

[54] METHOD OF MANUFACTURING A WIRING LAYER INCLUDING AMORPHOUS SILICON AND REFRACTORY METAL SILICIDE

[75] Inventor: Junichi Tsuchimoto, Hyogo, Japan

[73] Assignee: Mitsubishi Denki Kabushiki Kaisha, Tokyo, Japan

[21] Appl. No.: 313,937

[22] Filed: Sep. 28, 1994

Related U.S. Application Data

[62] Division of Ser. No. 206,586, Mar. 7, 1994, abandoned.

[30] Foreign Application Priority Data

Mar. 26, 1993 [JP] Japan .................................. 5-68185

[51] Int. Cl.⁶ .................................................. H01L 21/44
[52] U.S. Cl. ........................... 437/193; 437/200; 437/201
[58] Field of Search .................................... 437/200, 201, 437/193; 257/382, 383, 384, 757, 768, 770; 148/DIG. 147

[56] References Cited

U.S. PATENT DOCUMENTS

| | | | |
|---|---|---|---|
| 3,653,120 | 4/1972 | Sirrine et al. | 437/200 |
| 4,398,335 | 8/1983 | Lehrer | 257/755 |
| 4,458,410 | 7/1984 | Sugaki et al. | 437/200 |
| 4,731,642 | 3/1988 | Katto et al. | 257/755 |
| 4,742,025 | 5/1988 | Ohyu et al. | 437/200 |
| 4,777,150 | 10/1988 | Deneuville | 437/200 |
| 4,829,363 | 5/1989 | Thomas et al. | 357/71 |
| 4,920,071 | 4/1990 | Thomas | 437/190 |
| 4,974,057 | 11/1990 | Brodsky et al. | 357/71 |
| 5,250,846 | 10/1993 | Kondo | 257/756 |
| 5,268,590 | 12/1993 | Pfiester | 257/764 |
| 5,397,910 | 3/1995 | Ishimaru | 257/387 |

FOREIGN PATENT DOCUMENTS

| | | |
|---|---|---|
| 2-32537 | 2/1990 | Japan . |
| 2077993 | 12/1981 | United Kingdom . |

*Primary Examiner*—George Fourson
*Assistant Examiner*—Thomas G. Bilodeau
*Attorney, Agent, or Firm*—Lowe, Price, LeBlanc & Becker

[57] ABSTRACT

According to a semiconductor device and a manufacturing method thereof of the invention, silicon electrodes are connected to silicon layers in a wiring layer including silicon layers and refractory metal silicide layers formed on silicon layers and an amorphous silicon layer formed on the refractory silicide layer. Thus, good contact between the silicon electrodes and the wiring layer can be provided without the influence of a native oxide film formed on the surface of the refractory metal silicide layers. As a result, a semiconductor device and a manufacturing method thereof implementing reduced contact resistance to a wiring layer including a refractory metal silicide film can be provided.

1 Claim, 14 Drawing Sheets

HEAT TREATING TEMPERATUR

METHOD OF MANUFACTURING A WIRING LAYER INCLUDING AMORPHOUS SILICON AND REFRACTORY METAL SILICIDE

This application is a division of application Ser. No. 08/206,586, filed Mar. 7, 1994, now abandoned.

BACKGROUND OF THE INVENTION

1. Field of the Invention

The present invention relates generally to semiconductor devices and manufacturing methods thereof, and more specifically, to a semiconductor device capable of high performance with reduced contact resistance with a wiring structure used in the device and a method of manufacturing such a semiconductor device.

2. Description of the Background Art

In recent years, silicon thin films are used as materials for wiring and electrodes in silicon semiconductor devices. This is because a silicon thin film is thermally stable, its resistance can be reduced by implanting impurity such as phosphorus, arsenic, and boron, and deposition/treatment of the film is relatively easy.

As the integration densities of silicon semiconductor devices increase, however, the width of a wiring layer is reduced and even a silicon thin film implanted with impurity suffers from its wiring resistance.

Accordingly, a refractory metal silicide/silicon thin film structure in which a refractory metal silicide layer is deposited on a silicon thin film is often used.

The refractory metal silicide used for the structure includes tungsten silicide, molybdenum silicide, nickel silicide, cobalt silicide, and titanium silicide. Tungsten, molybdenum, nickel, cobalt, titanium and the like are used for their thermal stability, resistance smaller than an impurity implanted silicon thin film, little mutual diffusion when used in upper and lower layers of a wiring layer, and stability when formed into a stacked layer structure.

As described above, a refractory metal silicide/silicon thin film structure is used as a low resistance wiring material. In a silicon semiconductor device, however, in addition to the wiring layer, there are a number of overlying layers present with insulating films therebetween.

In such a structure, contact resistance between upper layer wiring and lower layer wiring is of great significance. More specifically, unlike a conventional single layer of silicon thin film, if a refractory metal silicide is present on a wiring layer, contact resistance with the overlying refractory metal silicide will be higher than contact resistance with a conventional silicon thin film.

This is because a native oxide film, removal of which is not easy, is likely to form on the refractory metal silicide and contact resistance increases as a result.

A technique for solving this problem is disclosed in, for example, Japanese Patent Laying-Open No. 2-32537.

According to this technique, in order to remove an oxide film formed on the surface of a refractory metal silicide, the semiconductor substrate is subjected to a heat treatment at 800° C. in a hydrogen atmosphere.

This heat treatment removes the native oxide film and reduced contact resistance results.

The above-described prior art technique however suffers from the following problems.

Firstly, as described above, the native oxide film is removed away by performing a heat treatment at 800° C. in a hydrogen atmosphere.

Figure 27:
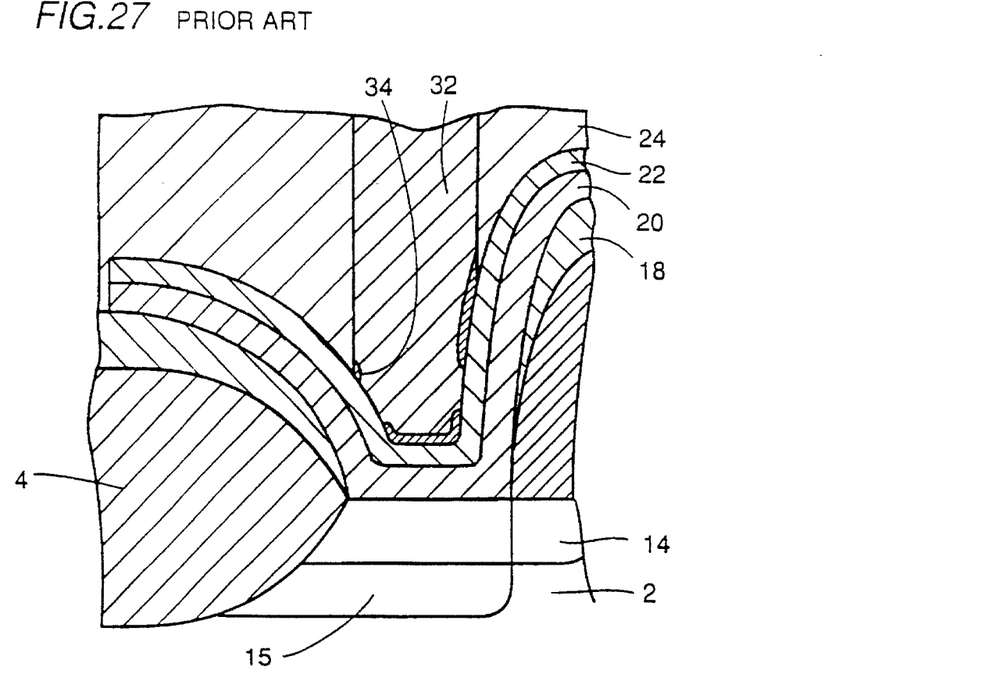
FIGS. 27 to 29 are first to third views for use in illustration of problems associated with conventional techniques.

However, since the native oxide film formed on the refractory metal silicide layer cannot be removed completely, as illustrated in a cross section in FIG. 27, native oxide film 34 partially remains at the contact portion, and the contact resistance value cannot be lowered to a desired value.

Note that the cross section in FIG. 27 shows the contact portion to source/drain regions 14, 15 in an active region surrounded by the element isolation region 4 of a semiconductor substrate 2.

Formed on the surface of source/drain regions 14, 15 are a polysilicon layer 20 and a refractory metal silicide film 22. A silicon electrode 32 is connected to refractory metal silicide film 22 with an interlayer insulating film 24 therebetween. Unremoved part of native oxide film 34 remains on the surface of refractory metal silicide film 22.

Figure 28:
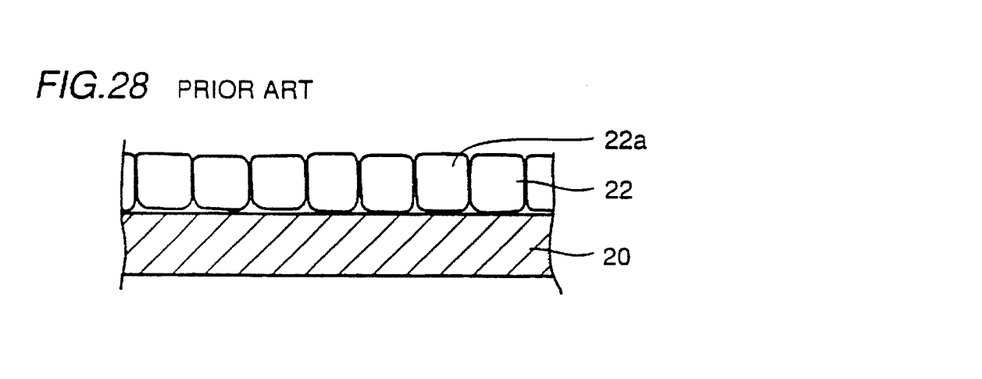

Secondarily, refractory metal silicide film 22 removed of the silicon oxide film is still encountered with another problem. The crystal structure of refractory metal silicide film 22 is as illustrated in FIG. 28 an arrangement of large crystals 22a.

Accordingly, if a silicon thin film is formed on refractory metal silicide film 22, monosilane used for forming the silicon thin film passes through gaps between crystals 22a.

Figure 29:
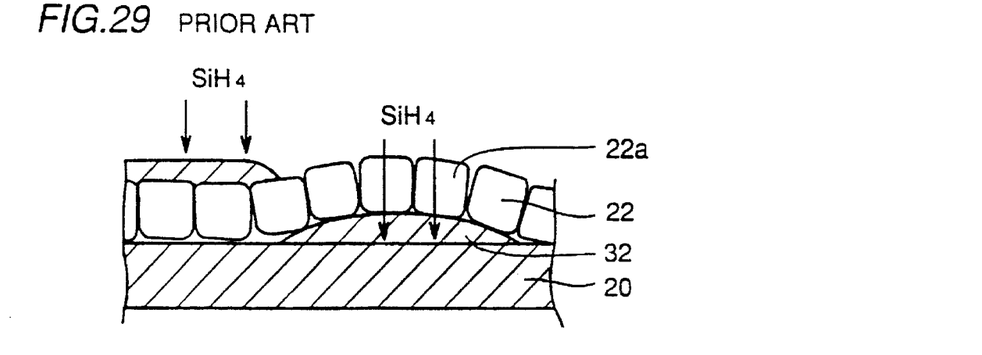

Therefore, referring to FIG. 29, a new silicon layer 32 is formed on silicon layer 20 under refractory metal silicide film 22. Thus, refractory metal silicide film 22 is lifted up and comes off from silicon layer 20.

SUMMARY OF THE INVENTION

The present invention is directed to a solution to the above-described problems, and it is an object of the invention to provide a semiconductor device permitting reduced contact resistance to a wiring layer including a refractory metal silicide layer, and a manufacturing method thereof.

In order to achieve the above-described object, a semiconductor device according to the invention in one aspect includes a wiring layer including a silicon layer and a refractory metal silicide layer formed on the silicon layer, an insulating layer formed on the wiring layer and a silicon electrode electrically connected to the wiring layer through a contact hole provided at the insulating layer. The silicon electrode is connected to the silicon layer. Thus, contact between the silicon electrode and the wiring layer can be provided without the influence of a native oxide film formed on the refractory metal silicide layer.

More preferably, an insulating film is provided between the silicon electrode and the refractory metal silicide layer.

In order to achieve the above-described object, a semiconductor device according to the invention in another aspect includes a wiring layer including a first silicon layer, a refractory metal silicon layer formed on the first silicon layer, a second silicon layer formed on the refractory metal silicide layer, an insulating layer formed on the wiring layer, and a silicon electrode electrically connected to the wiring layer through a contact hole formed in the insulating layer.

Thus, contact between the silicon electrode and the wiring layer can be provided without the influence of a native oxide film formed at the refractory metal silicide layer.

In order to achieve the above-described object, a method of manufacturing a semiconductor device according to the invention includes the following steps.

A silicon layer of a prescribed thickness is formed. Then, a refractory metal silicide layer is formed on the silicon layer.

Then, an insulating film is formed on the refractory metal silicide layer. A contact hole reaching the refractory metal silicide layer is formed on the insulating film by a photolithography technique.

The surface of refractory metal silicide layer exposed in the contact hole is subjected to a heat treatment at a temperature of 850° C. or higher in a hydrogen atmosphere. Then, in the furnace used for the heat treatment, silicon is deposited in the contact hole to form a silicon electrode electrically connected to the refractory metal silicide layer.

Thus, monosilane used for forming the silicon film on the refractory metal silicide film is kept from reaching the silicon layer under the refractory metal silicide layer by the function of a native oxide film.

Accordingly, a new silicon film is not formed on the silicon layer under the refractory metal silicide layer, and therefore the refractory metal silicide layer can be prevented from being lifted up and coming off.

As a result, contact resistance with the silicon electrode can be reduced.

More preferably, 100 ppm or smaller of monosilane is added in the heat treatment.

More preferably, the step of forming the refractory metal silicide layer includes forming a first refractory metal silicide layer of a prescribed thickness, taking out the first refractory metal silicide layer from the furnace, forming a native oxide film on the surface of the first refractory metal silicide, and forming a second refractory metal silicide film of a prescribed thickness on the native oxide film.

A method of manufacturing a semiconductor device according to the invention in another aspect includes the following steps.

A silicon layer of a prescribed thickness is formed. Then, a refractory metal silicide layer is formed on the silicon layer.

An insulating film is formed on the refractory metal silicide layer. Then, a contact hole reaching the refractory metal silicide layer is formed in the insulating film by a photolithography technique.

The surface on the refractory metal silicide layer exposed in the contact hole is subjected to a heat treatment at a temperature in the range from 750° C. to 820° C. in a hydrogen atmosphere. Then, in the furnace used for the heat treatment, amorphous silicon is deposited in the contact hole and a prescribed heat treatment is performed to form a silicon electrode electrically connected to the refractory metal silicide layer.

Thus, a native oxide film formed on the surface of the refractory metal silicide layer is not be completely removed away but left thin.

Then, amorphous silicon is deposited on the refractory metal silicide layer. At the time, the remaining thin native oxide film prevents monosilane from reaching onto the silicon layer under the refractory metal silicide layer.

Accordingly, a new silicon film will not be formed on the silicon layer under the refractory metal silicide film, and therefore the refractory metal silicide layer can be prevented from being lifted up and coming off.

Then, a heat treatment for forming the amorphous silicon into polycrystalline silicon is performed, which eliminates the native oxide film.

As a result, good contact can be provided between the silicon electrode and the wiring layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the invention will be described in conjunction with the accompanying drawings.

Figure 1:
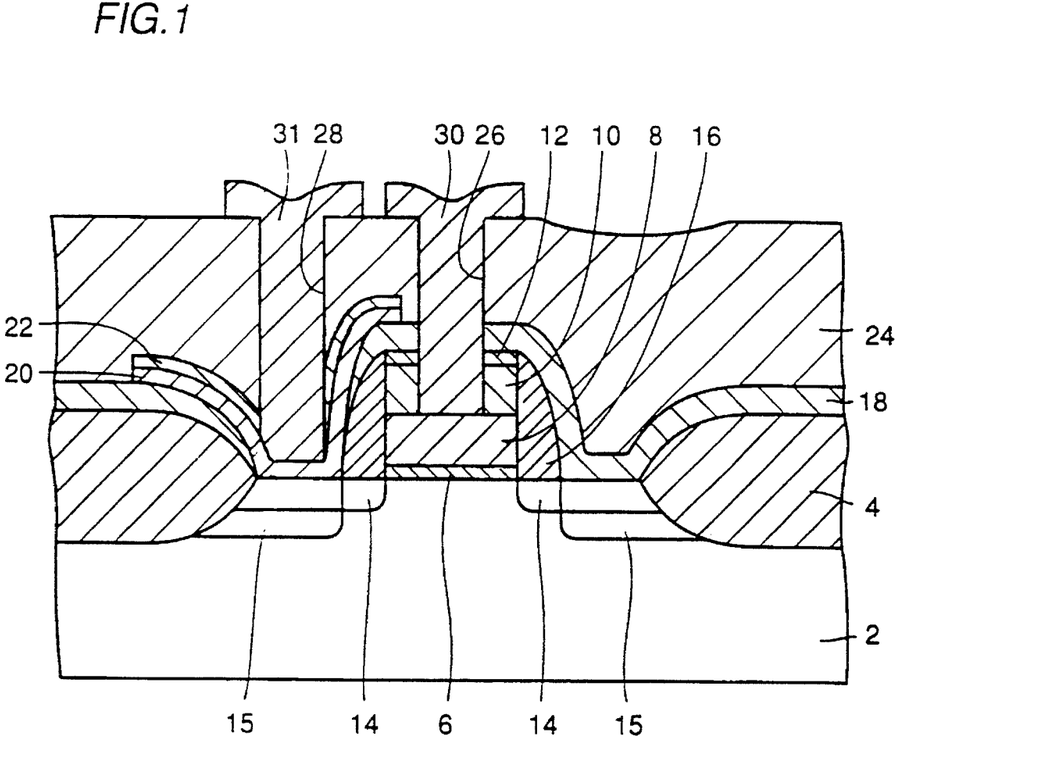
FIG. 1 is a cross sectional view showing the structure of a semiconductor device according to a first embodiment of the invention.

Referring to FIG. 1, the structure of a semiconductor device according to the embodiment will be described.

An element isolation region 4 is formed on a semiconductor substrate 2. A polysilicon layer 8 is formed on an active region surrounded by element isolation region 4 with a gate oxide film 6 therebetween.

Formed on polysilicon layer 8 is a refractory metal silicide layer 10 formed of tungsten silicide, molybdenum silicide, nickel silicide, cobalt silicide or titanium silicide. Polysilicon layer 8 and refractory metal silicide layer 10 constitute a gate electrode (word line).

An upper insulating film 12 is formed on refractory metal silicide layer 10. A sidewall insulating film 16 is formed on the side surface of upper insulating film 12, refractory metal silicide layer 10, polysilicon layer 8, and gate oxide film 6.

In the active region of semiconductor substrate 2, a low concentration impurity region 14 and a high concentration impurity region 15 are formed at positions having a gate electrode therebetween. Low concentration impurity region 14 and high concentration impurity region 15 constitute the source/drain regions of an MOS transistor.

One of the source/drain regions is covered with an insulating film 18. In the other of the source/drain regions, polysilicon layer 20 and refractory metal silicide layer 22 are formed to provide electrical contact with the source/drain regions. Polysilicon layer 20 and refractory metal silicide layer 22 constitute a bit line. An interlayer insulating film 24 is deposited in a prescribed thickness on the entire surface of semiconductor substrate 2.

Formed in interlayer insulating film 24 are a contact hole 26 forming a gate electrode and reaching polysilicon layer 8, and a contact hole 28 reaching polysilicon layer 20.

Silicon electrodes 30 and 31 are formed in these contact holes 26 and 28, respectively to electrically connect with polysilicon layers 8 and 20, respectively.

Use of the above-described structure permits good contact between silicon electrodes 30 and 31 and the wiring layer without the influence of a native oxide film formed of a silicon oxide film formed on surfaces of refractory metal silicide layer 10 and refractory metal silicide layer 22.

A manufacturing process of the semiconductor device having the above-described structure will be described in conjunction with FIGS. 2 to 12.

Figure 2:
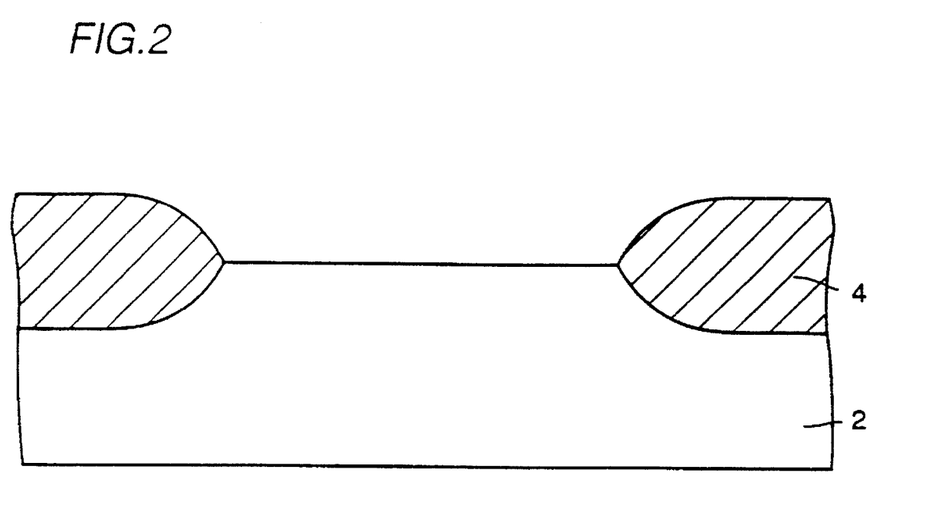
FIGS. 2 to 12 are cross sectional views showing 1st–11th steps in the manufacture of the semiconductor device according to the first embodiment of the invention.

Referring to FIG. 2, element isolation region 4 is formed on semiconductor substrate 2 by means of LOCOS (Local Oxidation of Silicon).

Figure 3:
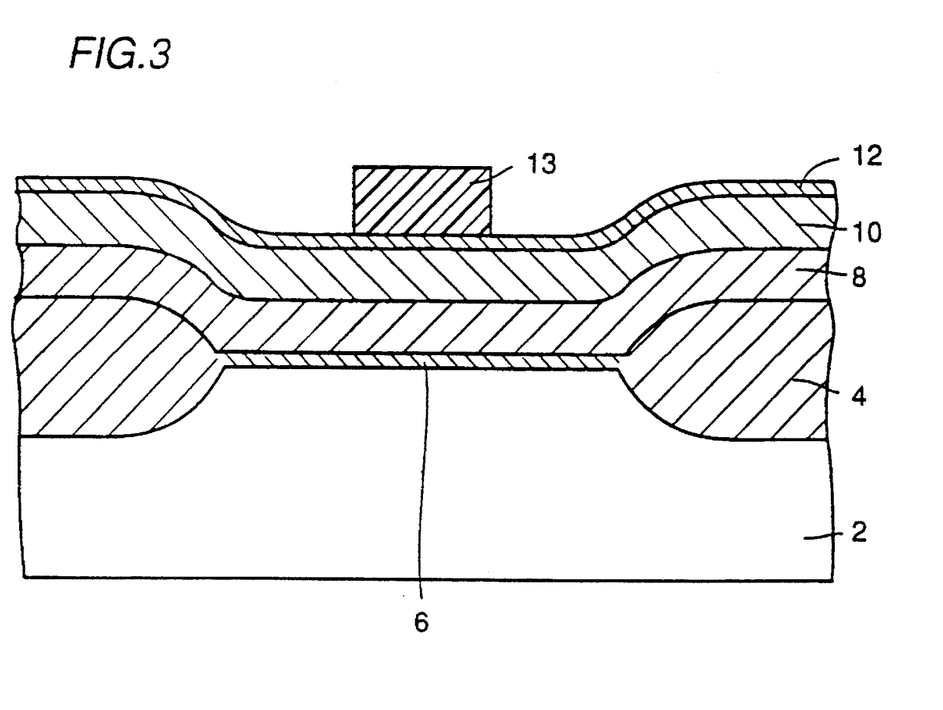

Referring to FIG. 3, gate oxide film 6 is formed on a surface of semiconductor substrate 2. Polysilicon layer 8 is formed in a thickness about in the range from about 800 Å to 1000 Å on gate oxide film 6 by CVD (Chemical Vapor Deposition).

A tungsten silicide film 10 as a refractory metal silicide film is formed in a thickness about in the range from 800 Å to 1000 Å by sputtering. Upper insulating film 12 is formed on tungsten silicide film 10. A resist film 13 patterned into a prescribed form by photolithography is formed at a prescribed position of upper insulating film 12.

Figure 4:
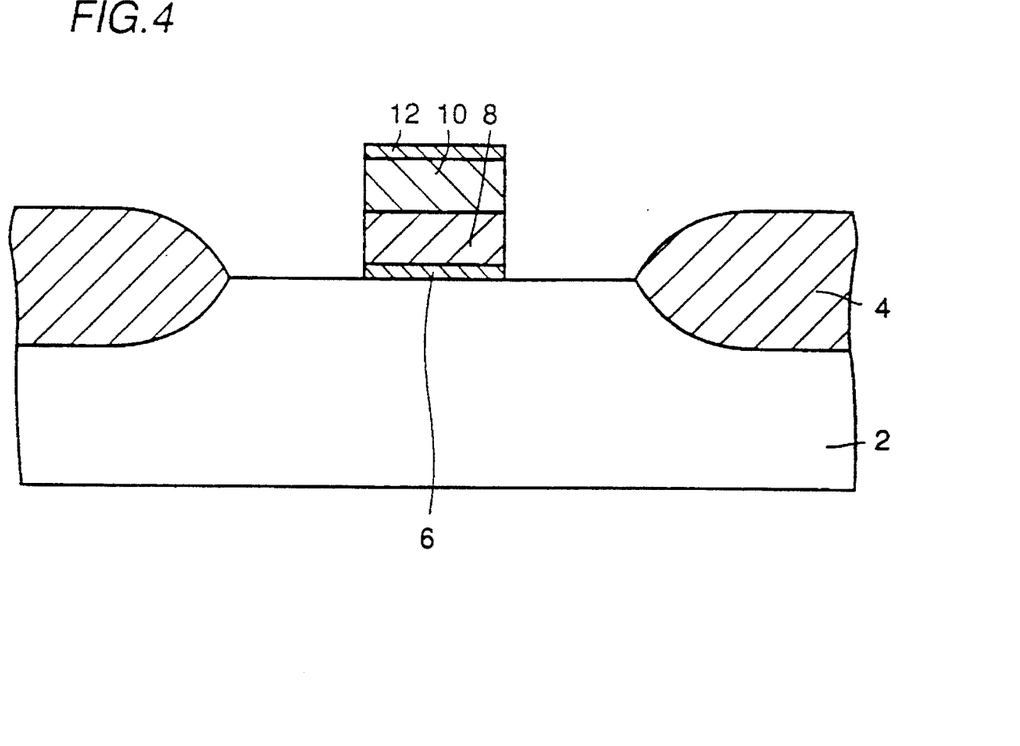

Then, referring to FIG. 4, upper insulating film 12, tungsten silicide film 10, polysilicon layer 8 and gate oxide film 6 are etched using resist film 13 as mask. Resist film 13 is then removed away.

Figure 5:
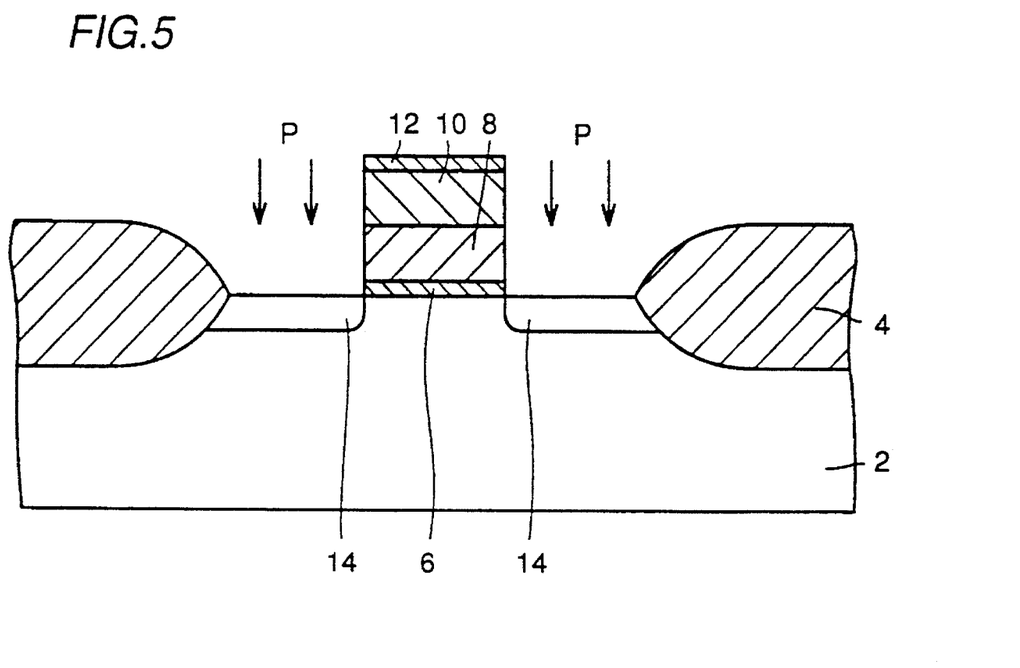

Referring to FIG. 5, using upper insulating film 12, tungsten silicide film 10, polysilicon film 8, and gate oxide film 6 as mask, impurity such as phosphorus is implanted into the surface of semiconductor substrate 2 to form low concentration impurity region 14.

Figure 6:
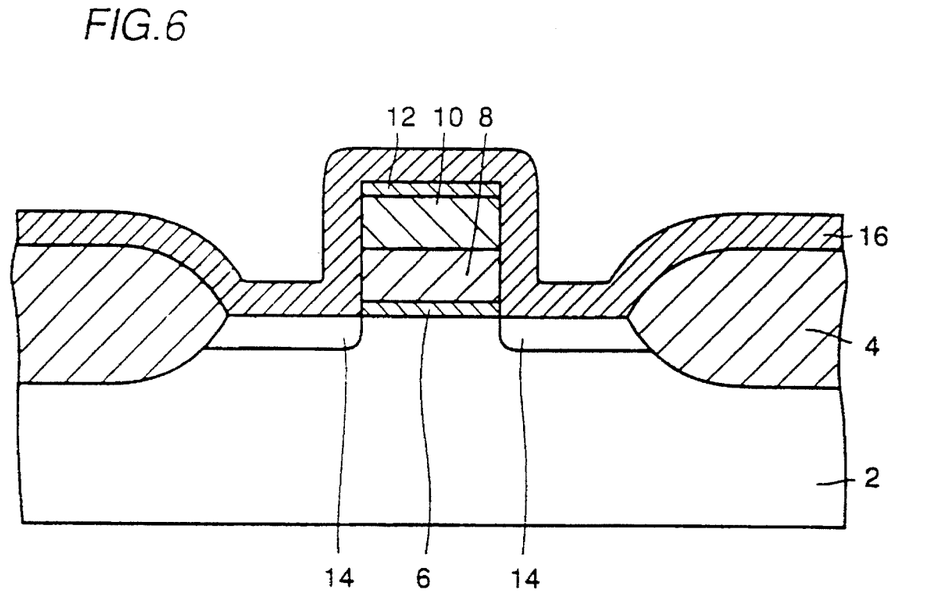
Figure 7:
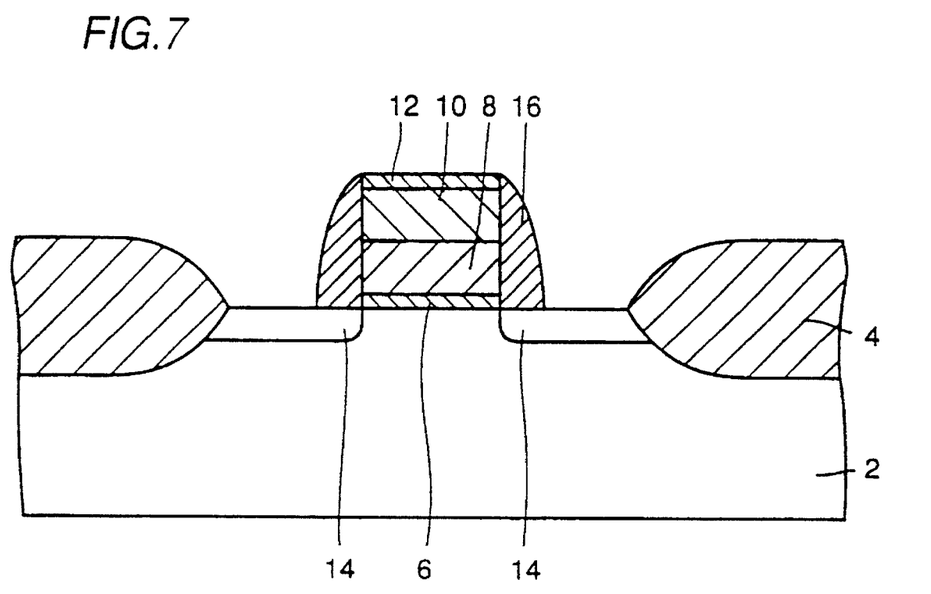

Referring to FIG. 6, polysilicon layer 16 is deposited on the entire surface of semiconductor substrate 2. Referring to FIG. 7, polysilicon layer 16 is anisotropically etched to form side insulating film 16.

Figure 8:
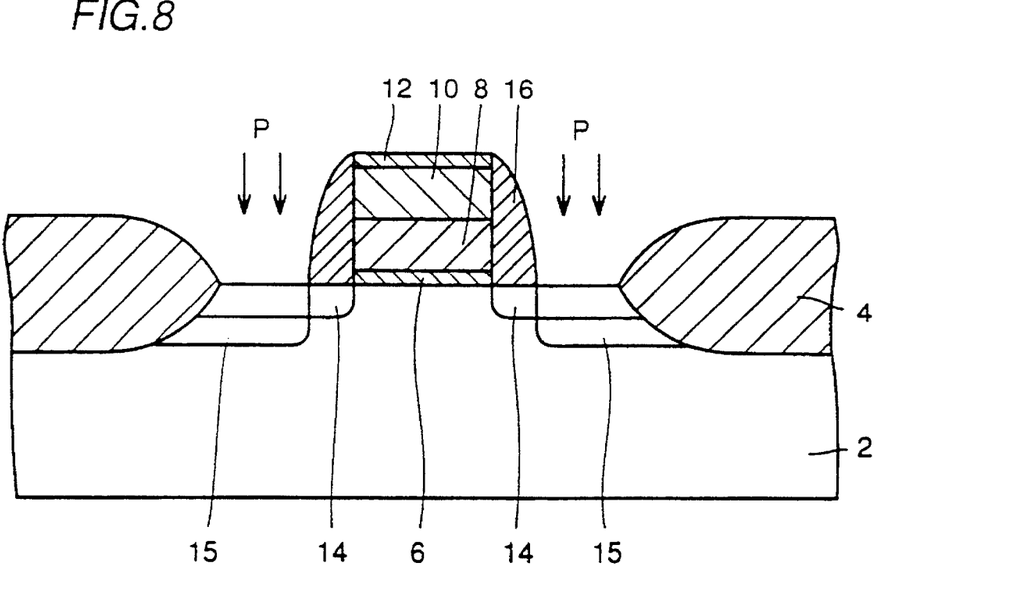

Referring to FIG. 8, using upper insulating film 12 and sidewall insulating film 16 as mask, impurity such as phosphorus is once again implanted into the surface of semiconductor substrate 2 to form high concentration impurity region 15.

Figure 9:
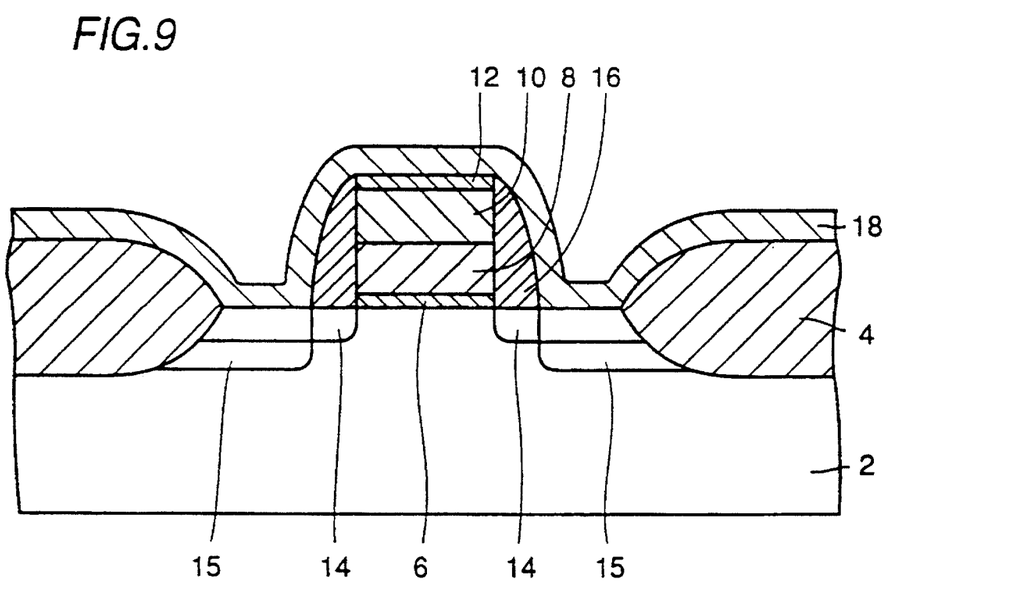

Referring to FIG. 9, insulating film 18 is deposited on the entire surface of semiconductor substrate 2.

Figure 10:
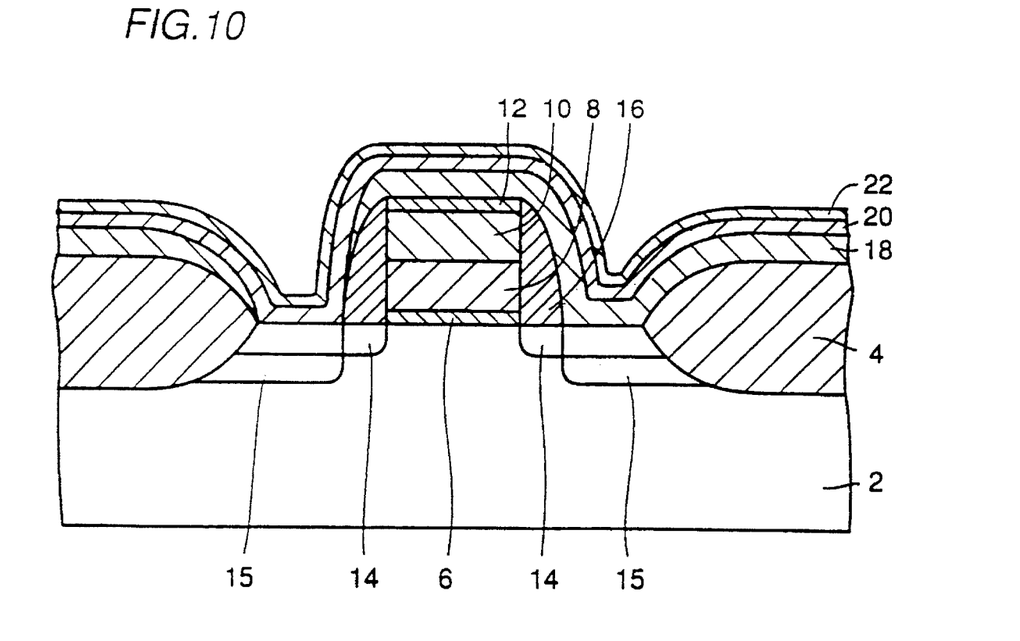

Then, referring to FIG. 10, insulating film 18 deposited on one of low concentration impurity region 14 and high concentration impurity region 15 is etched away.

Polysilicon layer 20 is deposited in a thickness in the range from 500 Å to 1000 Å on the entire surface of semiconductor substrate 2. Tungsten silicide layer 22 is deposited as a refractory metal silicide layer in a thickness in the range from 500 Å to 1000 Å on polysilicon layer 20.

Figure 11:
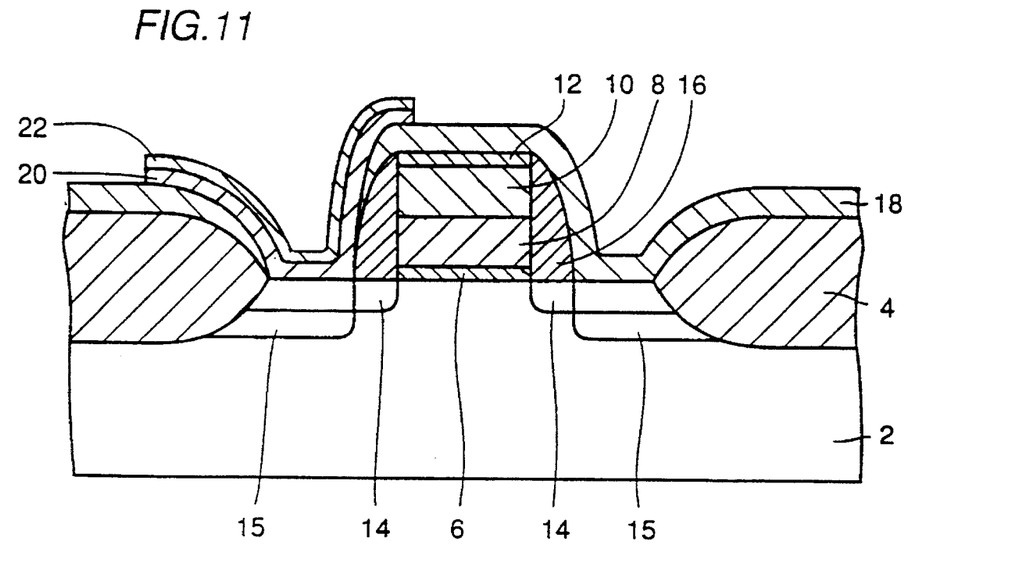

Referring to FIG. 11, polysilicon layer 18 and tungsten silicide layer 22 are etched into a prescribed form.

Figure 12:
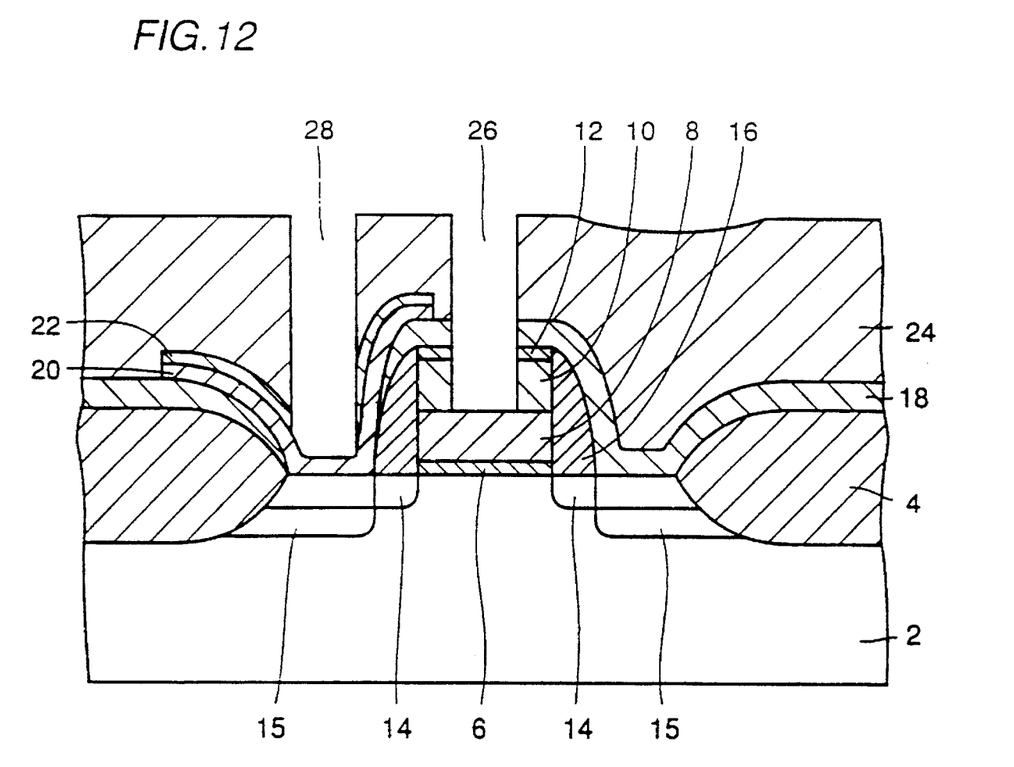

Referring to FIG. 12, interlayer insulating film 24 is deposited on the entire surface of semiconductor substrate 2. Contact holes 26 and 28 connecting polysilicon layers 8 and 20, respectively are formed in interlayer insulating film 24 by dry etching using a $Cl_2$ or $CF_4$ based etchant.

Then, silicon electrodes 30 and 31 formed of silicon thin films are formed inside contact holes 26 and 28, respectively using monosilane as a material. The semiconductor device shown in FIG. 1 is thus completed.

A second embodiment of the invention will be described in conjunction with the drawings.

Figure 13:
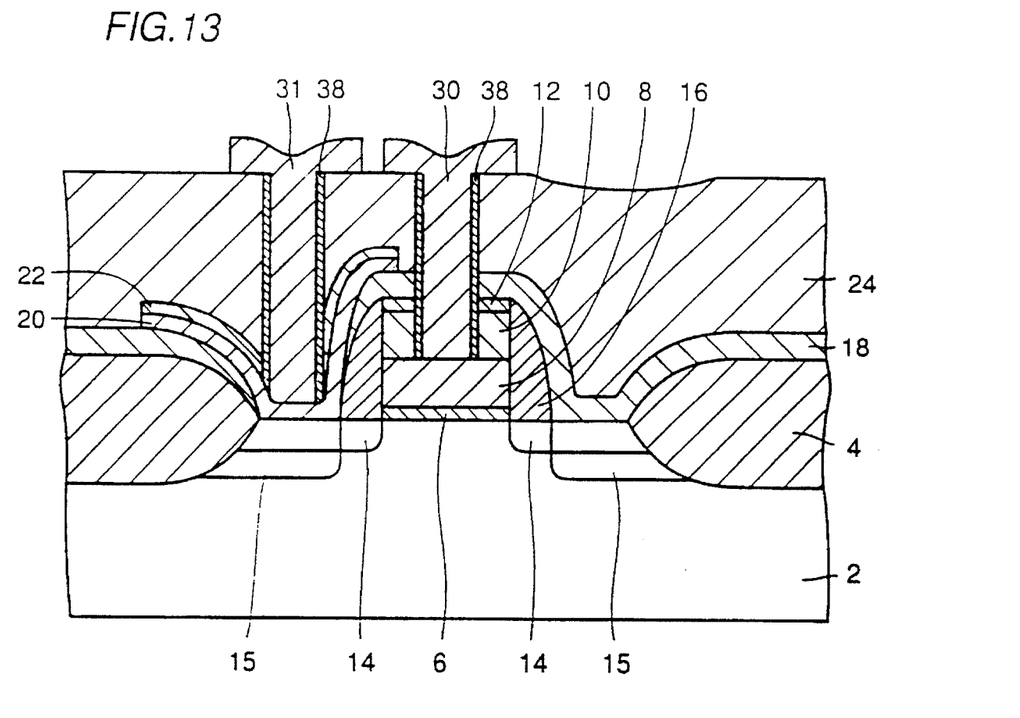
FIG. 13 is a cross sectional view showing the structure of a semiconductor device according to a second embodiment of the invention.

Referring to FIG. 13, the structure of a semiconductor device according to the embodiment will be described.

The structure of the semiconductor device according to the second embodiment is substantially identical to that of the semiconductor device according to the first embodiment, with difference being that side insulating films 38 are formed on the interfaces with silicon electrodes 30 and 31 in contact holes 26 and 28.

Unlike the embodiment shown FIG. 1 in which silicon electrodes 30 and 31 are directly connected to refractory metal silicide layers 10 and 22, respectively, side insulating films 38 are formed to prevent silicon electrodes 30 and 31 from being silicidated.

A process of manufacturing the semiconductor device according to the second embodiment will be described in conjunction with FIG. 14. Steps until formation of contact holes 26 and 28 according to the embodiment are the same as those described in the first embodiment in conjunction with FIGS. 2 to 12, and therefore description thereof is omitted here.

Figure 14:
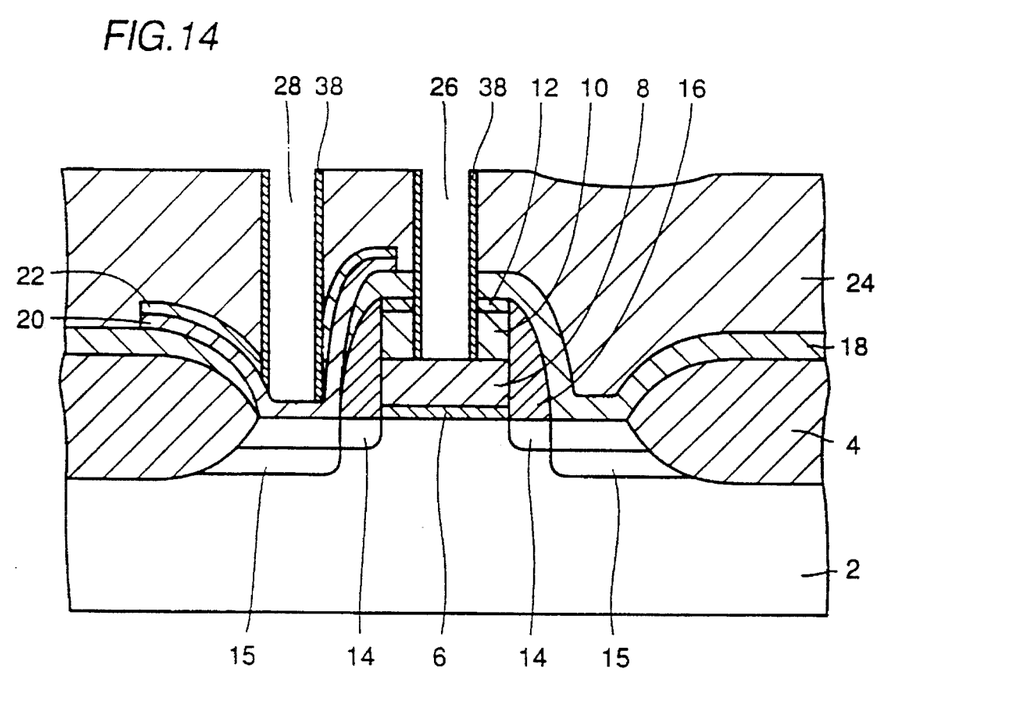
FIG. 14 is a cross sectional view showing essential part of the manufacturing process of the semiconductor device according to the second embodiment of the invention.

Referring to FIG. 14, after contact holes 26 and 28 are formed, an oxide film 38 in a thickness of about 500 Å is formed on the entire surface of the substrate by thermal oxidation at a deposition temperature of about 650° C. Then, oxide film 38 is vertically etched using a dry etching method, and sidewall insulating films 38 are formed only on the sidewalls of contact holes 26 and 28.

Then, as is the case with the first embodiment, a silicon thin film is deposited inside contact holes 26 and 28 using monosilane as a material to form silicon electrodes 30 and 31, and the semiconductor device according to the second embodiment as illustrated in FIG. 13 can be formed.

A third embodiment of the invention will be in conjunction with the drawings.

Figure 15:
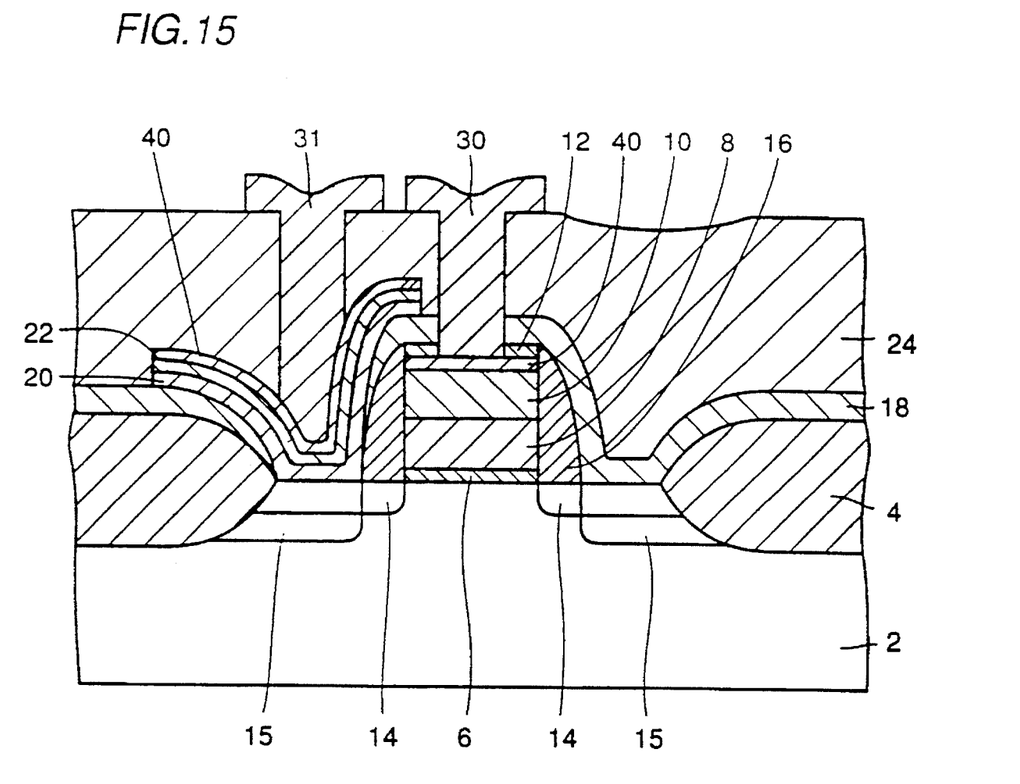
FIG. 15 is a cross sectional view showing the structure of a semiconductor device according to a third embodiment of the invention.

Referring to FIG. 15, the structure of the semiconductor device according to the embodiment will be described.

The structure of the semiconductor device according to the third embodiment is substantially identical to the structure of the semiconductor device according to the first embodiment shown in FIG. 1, except that polysilicon layers 40 are formed on refractory metal silicide layers 10 and 22, and that contact is made between polysilicon layer 40 and silicon electrodes 30 and 31.

Use of the above-described structure can also eliminate the influence of a native oxide film formed at refractory metal silicide layers 10 and 22 and provide good contact between the silicon electrodes and the wiring layer.

Steps in the manufacture of a semiconductor device having the above-described structure will be described in conjunction with FIGS. 16 to 18.

Note that description will be provided on characteristic parts in the embodiment as compared to the first embodiment and manufacturing steps in common will not be described.

Figure 16:
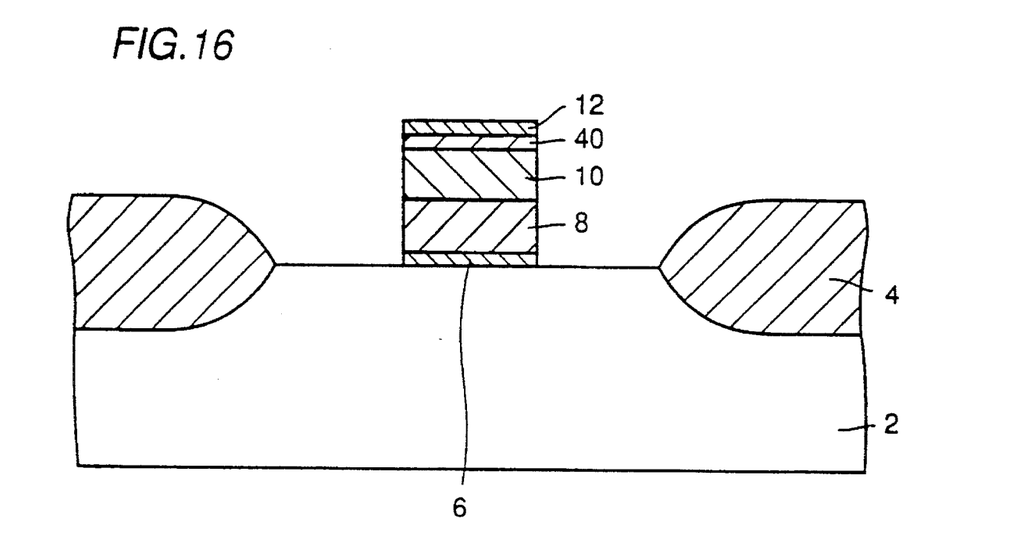
FIGS. 16 to 18 are cross sectional views showing essential part of the manufacturing process of the semiconductor device according to the third embodiment of the invention.
Figure 17:
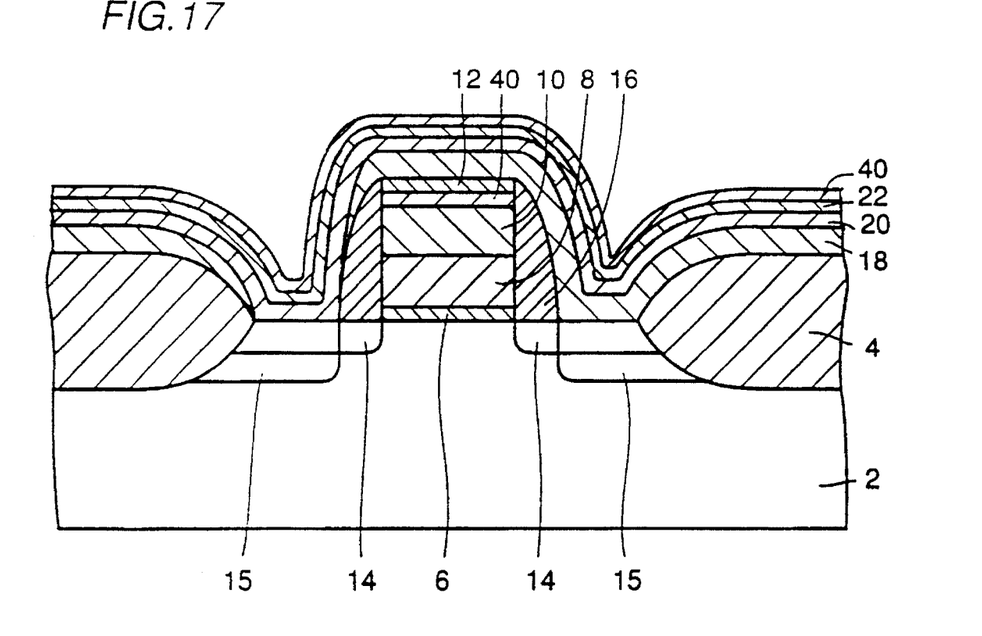

Referring to FIG. 16, gate oxide film 6 is formed on semiconductor substrate 2 having element isolation region 4 formed thereon. Polysilicon layer 8 is deposited on gate oxide film 6 in a thickness in the range from 800 to 1000 Å. Tungsten silicide layer 10 is deposited in a thickness in the range from 800 to 1000 Å on polysilicon layer 8 with a refractory metal silicide layer therebetween.

Polysilicon layer 40 is deposited in a thickness in the range from about 30 to 50 Å on tungsten silicide layer 10 in the same furnace. Upper insulating film 12 is deposited on polysilicon layer 40 and an etching into a prescribed form is performed by a photolithography technique.

Then, the steps the same as those shown in FIGS. 5 to 10 described in conjunction with the first embodiment are performed. Referring to FIG. 17, polysilicon layer 40 is deposited in a thickness in the range from 30 to 50 Å on tungsten silicide layer 22 as a refractory metal silicide layer.

Figure 18:
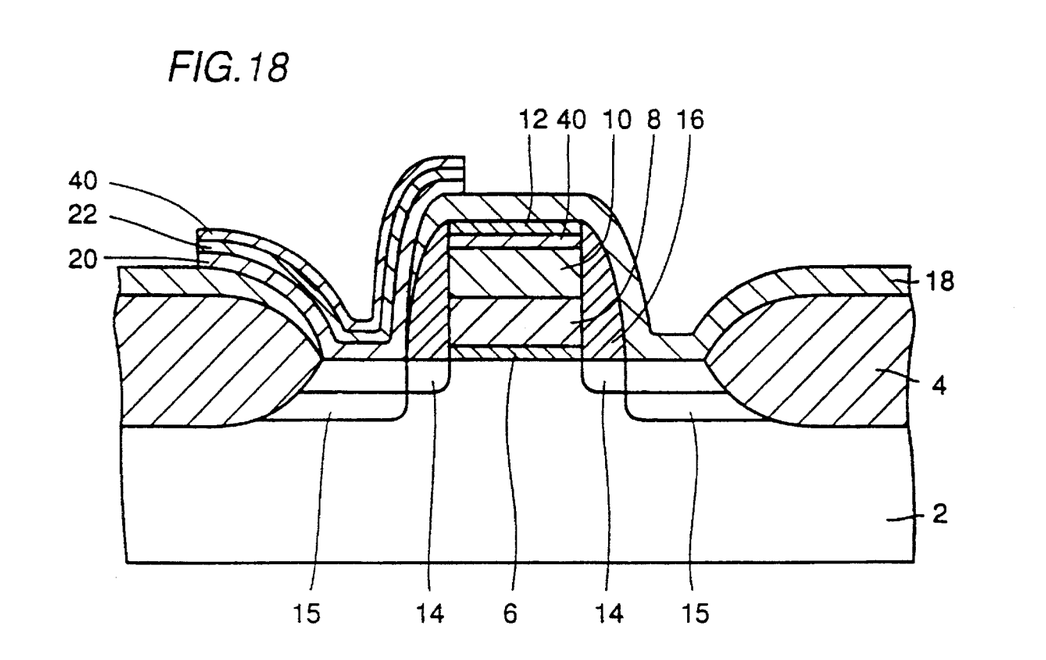

Referring to FIG. 18, polysilicon layer 40, titanium silicide layer 22, and polysilicon layer 20 are etched into a prescribed form. Interlayer insulating film 24 is deposited on the entire surface of the substrate.

Contact holes 26 and 28 reaching polysilicon layer 40 are opened. A silicon thin film is deposited inside contact holes 26 and 28 using monosilane as a material to form silicon electrodes 30 and 31, and the semiconductor device shown in FIG. 15 is thus completed.

A fourth embodiment of the invention will be described in conjunction with the drawings.

Figure 19:
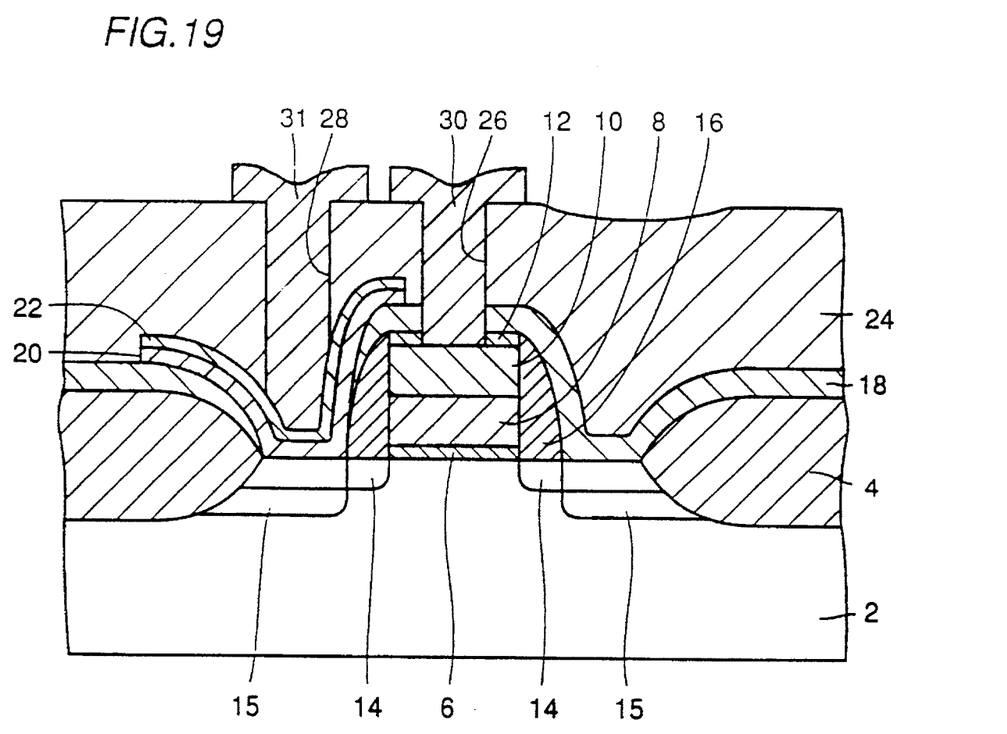
FIG. 19 is a cross sectional view showing the structure of a semiconductor device according to a fourth embodiment of the invention.

Referring to FIG. 19, the structure of the semiconductor device according to the embodiment will be described.

The semiconductor device according to the embodiment has silicon electrodes 30 and 31 connected to refractory metal silicide layers 10 and 22, respectively, and therefore is not different from the conventional structure.

However, no silicon oxide film which is conventionally formed is provided at the contact portions of silicon electrodes 30 and 31 and refractory metal silicide layers 10 and 22.

The manufacturing steps for providing contact between the silicon electrodes and refractory metal silicide layers without any native oxide film forming will be described.

According to conventional techniques, after contact holes 26 and 28 are formed, a heat treatment is performed at about 800° C. in a hydrogen atmosphere to remove native oxide film formed on the surfaces of refractory metal silicide layers 10 and 22. This heat treatment however cannot completely remove such native oxide films formed on the surfaces of refractory metal silicide layers 10 and 22.

Figure 20:
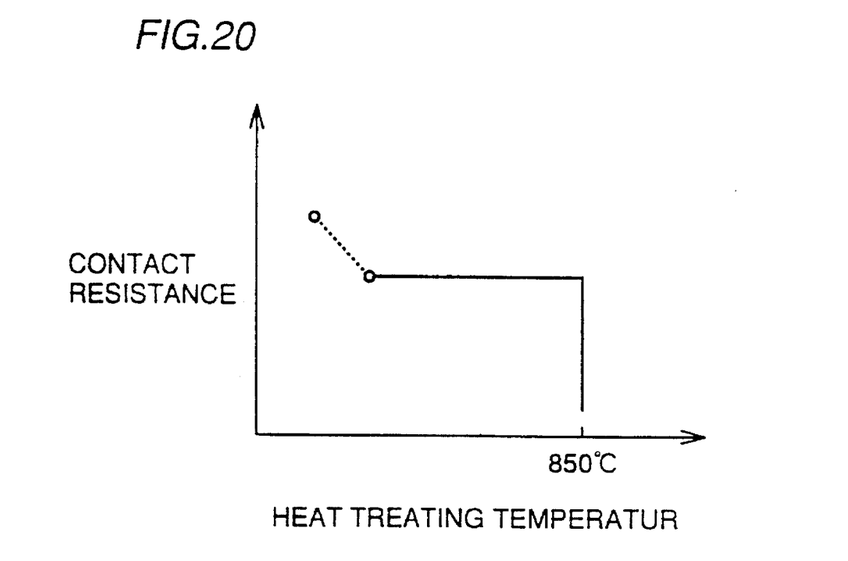
FIG. 20 is a representation showing the relation between heat treatment temperature and contact resistance.

In the present embodiment, as can be seen from a graph shown in FIG. 20, after contact holes 28 and 26 are opened, a heat treatment is performed at a temperature of 850° C. or higher under about 80 atm in a hydrogen atmosphere for about 1 minute and the native oxide film is almost completely removed away.

More preferably, addition of monosilane as much as 100 ppm at the time of heat treatment provides a chemical reaction given as follows:

$$SiH_4 + SiO_2 \rightarrow SiO\uparrow + H_2$$

in which native oxide films on refractory metal silicide layers 10 and 22 become volatile SiO and removal of such native oxide films on the refractory metal silicide layers is permitted more effectively.

Note that in this case the amount of monosilane added at the time of heat treatment must be at most 100 ppm, because addition of monosilane in excess of 100 ppm allows the monosilane not only to remove the oxide films but also to be deposited.

The fourth embodiment will be described in conjunction with the drawings.

A semiconductor device manufactured according to the fourth embodiment is substantially identical to the semiconductor device shown in FIG. 19 but steps in forming refractory metal silicide layers 10 and 22 are characteristic. Accordingly, only the steps of forming refractory metal silicide layers 10 and 22 will be described.

Figure 21:
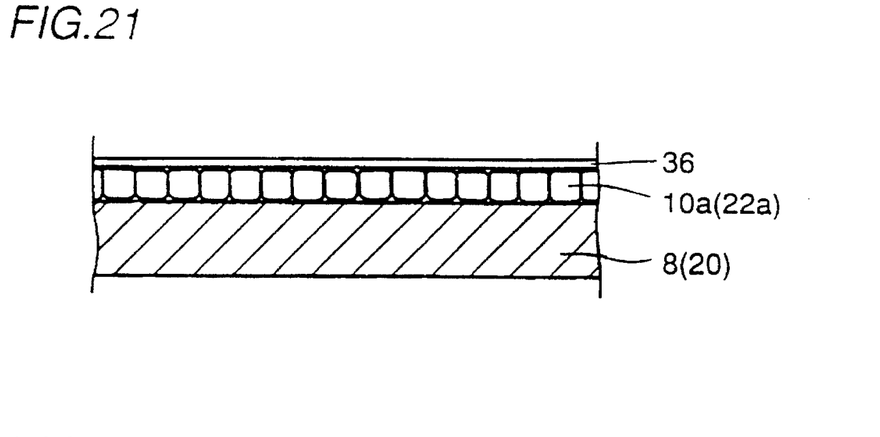
FIGS. 21 to 22 are first and second views showing essential part of the manufacturing process of the semiconductor device according to the fourth embodiment of the invention.

Referring to FIG. 21, refractory metal silicide layers 10a and 22a each in a thickness in the range from 300 to 500 Å are deposited on polysilicon layers 8 and 20, respectively, by usual sputtering process.

Then, the semiconductor substrate is taken out from the furnace of a device used for sputtering and a thin native oxide film 36 is formed on the surfaces of refractory metal silicide layers 10a and 22a.

Figure 22:
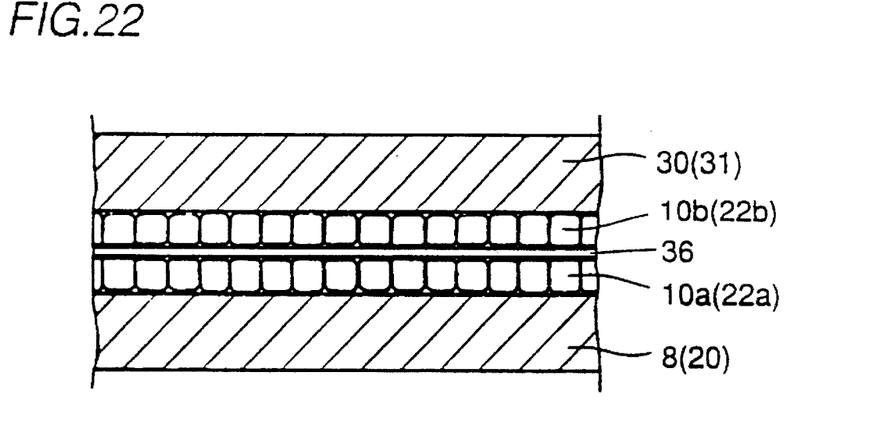

Then, referring to FIG. 22, refractory metal silicide layers 10b and 22b each in a thickness in the range from 300 to 500 Å are deposited on native oxide film 36.

Contact holes reaching refractory metal silicide layers 10b and 22b are opened, and then silicon electrodes 30 and 31 are deposited in a monosilane atmosphere.

At the time, the monosilane used for forming silicon electrodes 30 and 31 are kept from reaching silicon layers 8 and 20 under refractory metal silicide layers 10a and 22a by the function of native oxide film 36.

Accordingly, unlike conventional techniques, no new silicon film is formed on silicon layers 8 and 20 under refractory metal silicide layers 10a and 22a, and refractory metal silicide layers 10a and 22a can be prevented from being lifted up and coming off.

A fifth embodiment of the invention will be described in conjunction with the drawings.

Since the fifth embodiment has a main characteristic in a heat treatment prior to formation of silicon electrodes 30 and 31, the characteristic will be described.

Figure 23:
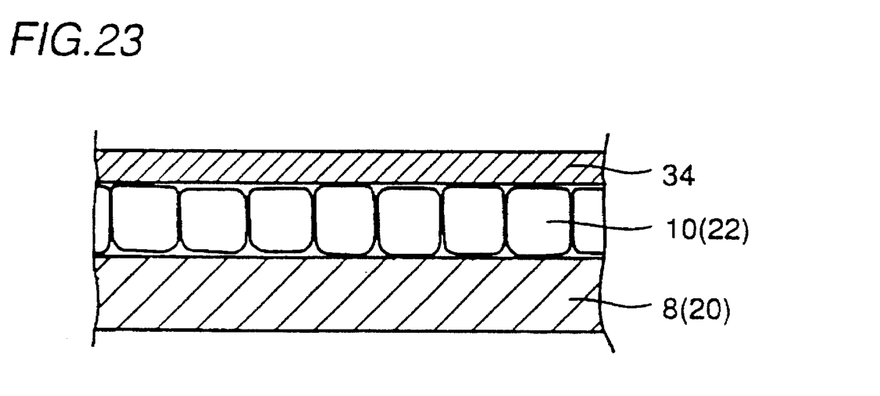
FIGS. 23 to 26 are first to fourth views showing essential part of a manufacturing process of a semiconductor device according to a fifth embodiment of the invention.

Referring to FIG. 23, immediately after formation of contact holes 26 and 28, a native oxide film 34 is formed on the surfaces of refractory metal silicide layers 10 and 22.

Figure 24:
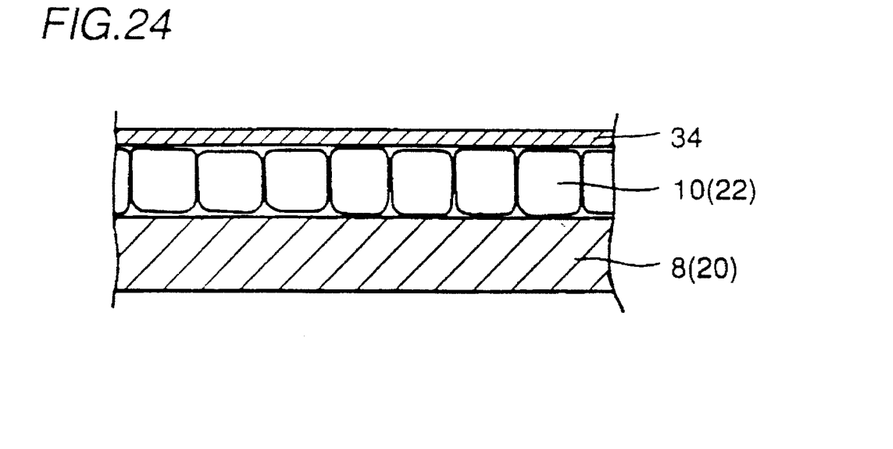

In order to remove native oxide film 34, a heating treatment is performed at a temperature in the range from 750° C. to 820° C. in a hydrogen atmosphere. Since the upper limit for the temperature of heat treatment is 820° C., which is lower than 850° C. in the fourth embodiment, a thin native oxide film 34 is present on the surfaces of refractory metal silicide layers 10 and 22 as illustrated in FIG. 24.

Figure 25:
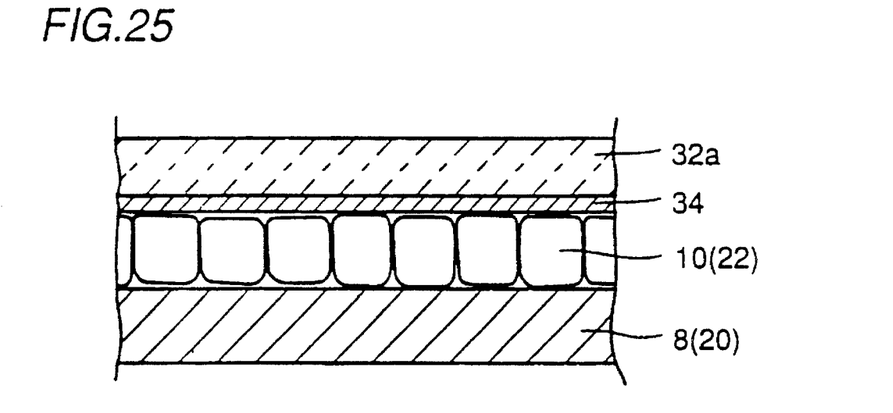

Referring to FIG. 25, an amorphous silicon layer 32a is deposited at about 850° C. on refractory metal silicide layers 10 and 22 including thin native oxide film 34. At the time, in the presence of native oxide film 34, monosilane used for forming amorphous silicon layer 32a is kept from reaching the surfaces of polysilicon layers 8 and 20 under the refractory metal silicide layers.

Accordingly, no new silicon film is formed on the polysilicon layers under the refractory metal silicide layers, and therefore the refractory metal silicide layers can be prevented from being lifted up and coming off.

Figure 26:
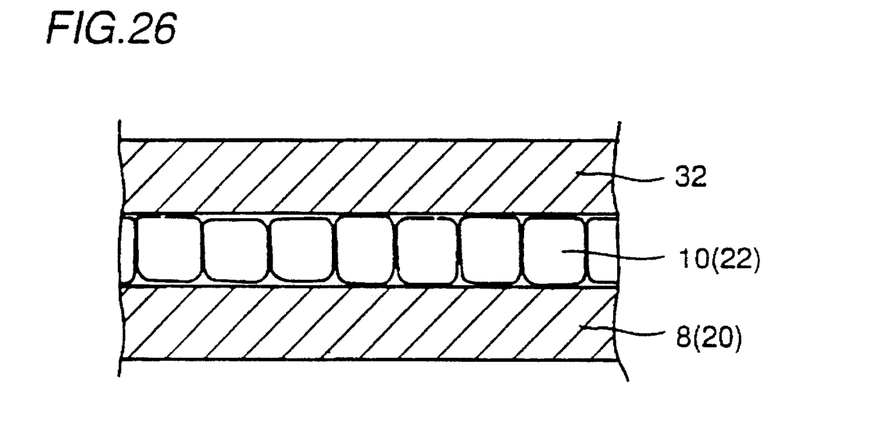

Then, referring to FIG. 26, in order to form amorphous silicon 32a into polysilicon, a heat treatment at a temperature in the range from 700° C. to 850° C. is performed and amorphous silicon layer 32a is formed into a polysilicon layer 32.

At the time, native oxide film 34 is taken into polysilicon layer 32, and good contact is provided between refractory metal silicide layers 10 and 22 and silicon electrodes 30 and 31, respectively.

Note that the heat treatment for forming the amorphous silicon layer into the polysilicon layer described above does not have to include the above-described steps, and the same effect can be obtained by forming the amorphous silicon layer into polysilicon at the time of another heat treatment in the manufacturing steps of the semiconductor device.

Note that although in the above-described embodiments a tungsten silicide layer is used for a refractory metal silicide layer, but this is by no means limitative and the same effects can be provided by the use of molybdenum silicide, nickel silicide, cobalt silicide, titanium silicide or the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming a silicon layer;

forming a refractory metal silicide layer on said silicon layer;

forming an insulating film on said refractory metal silicide layer;

forming a contact hole reaching the refractory metal silicide layer in said insulating film by a photolithography technique;

heat-treating a surface of the refractory metal silicide layer exposed in said contact hole in a hydrogen atmosphere at a temperature in the range from 750° C. to 820° C. in a furnace; and in the furnace used for said heat-treatment, depositing amorphous silicon in said contact hole and performing a heat treatment, thereby forming a silicon electrode electrically connected to said refractory metal silicide layer.

* * * * *